(12) United States Patent  
Busujima et al.

(10) Patent No.: US 8,737,020 B2
(45) Date of Patent: May 27, 2014

(54) SUSPENSION CIRCUIT BOARD, SUSPENSION FOR HARD DISK AND HARD DISK DRIVE HAVING STRESS DISPERSION

(75) Inventors: Shinichiro Busujima, Kita-Ku (JP); Yoichi Miura, Kawagoe (JP); Kenro Hirata, Itabashi (JP); Tempei Yamaoka, Tsukuba (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 13/514,406

(22) PCT Filed: Dec. 2, 2010

(86) PCT No.: PCT/JP2010/071577  
§ 371 (c)(1),  
(2), (4) Date: Jun. 7, 2012

(87) PCT Pub. No.: WO2011/074422  
PCT Pub. Date: Jun. 23, 2011

(65) Prior Publication Data  
US 2012/0243126 A1 Sep. 27, 2012

(30) Foreign Application Priority Data

Dec. 18, 2009 (JP) .................. 2009-287894  
Aug. 27, 2010 (JP) .................. 2010-191130

(51) Int. Cl.  
*G11B 21/16* (2006.01)  
*G11B 5/48* (2006.01)

(52) U.S. Cl.  
USPC .................................. 360/245.8

(58) Field of Classification Search  
CPC .. G11B 5/4833; G11B 5/4846; G11B 5/4853; G11B 5/486  
USPC .............. 360/245.8, 245.9, 246, 264.2, 266.3  
See application file for complete search history.

(56) References Cited

U.S. PATENT DOCUMENTS

| | | | |
|---|---|---|---|
| 7,649,144 | B2 | 1/2010 | Honjo |
| 2003/0026078 | A1 | 2/2003 | Komatsubara et al. |
| 2004/0228038 | A1 | 11/2004 | Nakamura et al. |
| 2006/0012921 | A1 | 1/2006 | Kubota et al. |
| 2009/0061660 | A1 | 3/2009 | Honjo |

FOREIGN PATENT DOCUMENTS

| | | |
|---|---|---|
| CN | 101378621 A | 3/2009 |
| JP | 2003-031915 A1 | 1/2003 |

(Continued)

OTHER PUBLICATIONS

International Search Report dated Feb. 15, 2011, for PCT/JP2010/071577.

(Continued)

*Primary Examiner* — Craig A. Renner  
(74) *Attorney, Agent, or Firm* — Burr & Brown, PLLC

(57) ABSTRACT

A suspension circuit board comprises a metal support board, a first insulation layer disposed on the metal support board a conductive layer disposed on the first insulation layer, the conductive layer forming a wire; and a second insulation layer disposed on the first insulation layer and the conductive layer. The suspension circuit board is configured that, upon applying a load in a thickness direction to the conductive layer at a position corresponding to the first insulation opening, $F_1 < F_2$, when a stress generated in the conductive layer at a position corresponding to a periphery of the first insulation opening is represented as a first stress $F_1$ and a stress generated in the conductive layer at a position corresponding to a periphery of the metal support board opening is represented as a second stress $F_2$.

8 Claims, 11 Drawing Sheets

(56) References Cited

FOREIGN PATENT DOCUMENTS

| | | |
|---|---|---|
| JP | 2004-335042 A1 | 11/2004 |
| JP | 2006-031764 A1 | 2/2006 |
| JP | 2009-054793 A1 | 3/2009 |

OTHER PUBLICATIONS

Chinese Office Action (corresponding to Application No. 201080057145.5) mailed Nov. 6, 2013.

US 8,737,020 B2

SUSPENSION CIRCUIT BOARD, SUSPENSION FOR HARD DISK AND HARD DISK DRIVE HAVING STRESS DISPERSION

CROSS REFERENCE TO RELATED APPLICATIONS

This application claims the benefit of priority from the prior Japanese Patent Application No. 2009-287894 filed on Dec. 18, 2009 and Japanese Patent Application No. 2010-191130 filed on Aug. 27, 2010, the entire contents of which are incorporated herein by reference.

FIELD OF THE INVENTION

The present invention relates to a suspension circuit board including a metal support board, a first insulation layer disposed on the metal support board, the first insulation layer being made of an insulation material, a conductive layer disposed on the first insulation layer, the conductive layer forming a wire, and a second insulation layer disposed on the first insulation layer and the conductive layer, the second insulation layer being made of an insulation material, and a suspension for hard disk and a hard disk drive, which include the suspension circuit board.

BACKGROUND ART

There has been conventionally known a wire circuit board in which a conductive layer is formed on a first insulation layer, a second insulation layer is formed on the first insulation layer and the conductive layer, and openings are formed in the first insulation layer and the second insulation layer at the same position in the conductive layer, so that a terminal portion in which a front surface and a rear surface of the conductive layer are exposed is formed (see JP2003-31915A). A terminal in which the front surface and the rear surface of the conductive layer are exposed is referred to as "flying lead". In the flying lead portion, since both of the surfaces of the conductive layer are exposed, ultrasonic waves are easily transmitted upon an ultrasonic bonding with a terminal portion of an external circuit board. Thus, the flying lead portion is suited for an ultrasonic vibration bonding. On the other hand, since the flying lead portion is poor in physical strength, there is a problem in that breaking of wire is likely to occur, because of a stress concentrated in the conductive layer.

In order to prevent such a problem, attempts have been conventionally made to acquire the strength of the conductive layer at the flying lead portion, so as to effectively prevent breaking of the conductive layer. For example, in JP2003-31915A, at an intersection point where an end periphery of the opening and the conductive layer intersect with each other, there is formed a reinforcement part for reinforcing the conductive layer along the end periphery of the opening.

SUMMARY OF THE INVENTION

The present invention is based on an idea different from the conventional art. The object of the present invention is to provide a suspension circuit board capable of preventing a conductive layer from being broken, by a method different from a conventional one. In addition, the object of the present invention is to provide a suspension for hard disk and a hard disk drive, using such a suspension circuit board.

A suspension circuit board according to the present invention comprises a metal support board;

a first insulation layer disposed on the metal support board, the first insulation layer being made of an insulation material;

a conductive layer disposed on the first insulation layer, the conductive layer forming a wire; and a second insulation layer disposed on the first insulation layer and the conductive layer, the second insulation layer being made of an insulation material;

wherein:

the first insulation layer is provided with a first insulation opening;

the metal support board is provided with a metal support board opening at a position overlapping with the first insulation opening in a direction along which the conductive layer is extended, so that a rear surface of the conductive layer is exposed;

the second insulation layer is provided with a second insulation opening at a position overlapping with the first insulation opening in the direction along which the conductive layer is extended, so that a front surface of the conductive layer is exposed; and upon applying a load in a thickness direction to the conductive layer at a position corresponding to the first insulation opening, $$F_1 < F_2,$$

when a stress generated in the conductive layer at a position corresponding to a periphery of the first insulation opening is represented as a first stress $F_1$ and a stress generated in the conductive layer at a position corresponding to a periphery of a metal support board opening is represented as a second stress $F_2$.

In the suspension circuit board according to the present invention, the suspension circuit board can be configured when a length of the first insulation opening in the direction along which the conductive layer is extended is represented as a length $L_1$ and a length of the metal support board opening in the direction along which the conductive layer is extended is represented as a length $L_2$, $$L_1 < L_2.$$

In the suspension circuit board according to the present invention, the suspension circuit board can be configured upon applying a load in the thickness direction to the surface of the conductive layer at a position corresponding to the first insulation opening, $$F_1 \le F_3 \text{ and } F_1 < F_2,$$

when a stress generated in the conductive layer at a position corresponding to a periphery of the second insulation opening is represented as a third stress $F_3$.

In the suspension circuit board according to the present invention, the suspension circuit board can be configured when a length of the first insulation opening in the direction along which the conductive layer is extended is represented as a length $L_1$ and a length of the metal support board opening in the direction along which the conductive layer is extended is represented as a length $L_2$, $$L_2 \ge 1.35 \times L_1.$$

In the suspension circuit board according to the present invention, the suspension circuit board can be configured when a length of the first insulation opening in the direction along which the conductive layer is extended is represented as a length $L_1$, a length of the metal support board opening in the direction along which the conductive layer is extended is represented as a length $L_2$, and a length of the second insulation opening in the direction along which the conducive layer is extended is represented as a length $L_3$, $$L_1 \leq L_3 < L_2.$$

In the suspension circuit board according to the present invention, a position of the conductive layer, which corresponds to the periphery of the first insulation opening, and a position of the conductive layer, which corresponds to the periphery of the metal support board opening, can be located at the same height.

In the suspension circuit board according to the present invention, a position of the conductive layer, which corresponds to the periphery of the first insulation opening, and a position of the conductive layer, which corresponds to the periphery of the metal support board opening, can be located at different heights, and the position corresponding to the periphery of the first insulation opening can be located lower than the position corresponding to the periphery of the metal support board opening.

In the suspension circuit board according to the present invention, the conductive layer can be extended in a slope shape or in a step shape, from the position corresponding to the periphery of the metal support board opening toward the position corresponding to the periphery of the first insulation opening.

In the suspension circuit board according to the present invention, the suspension circuit board can be capable of being bonded to an external circuit board by ultrasonic bonding.

A suspension for hard disk according to the present invention comprises a suspension circuit board, wherein the suspension circuit board has
a metal support board;
a first insulation layer disposed on the metal support board, the first insulation layer being made of an insulation material;
a conductive layer disposed on the first insulation layer, the conductive layer forming a wire; and
a second insulation layer disposed on the first insulation layer and the conductive layer, the second insulation layer being made of an insulation material;
wherein:
the first insulation layer is provided with a first insulation opening;
the metal support board is provided with a metal support board opening at a position overlapping with the first insulation opening in a direction along which the conductive layer is extended, so that a rear surface of the conductive layer is exposed;
the second insulation layer is provided with a second insulation opening at a position overlapping with the first insulation opening in the direction along which the conductive layer is extended, so that a front surface of the conductive layer is exposed; and
upon applying a load in a thickness direction to the conductive layer at a position corresponding to the first insulation opening, $$F_1 < F_2,$$

when a stress generated in the conductive layer at a position corresponding to a periphery of the first insulation opening is represented as a first stress $F_1$ and a stress generated in the conductive layer at a position corresponding to a periphery of a metal support board opening is represented as a second stress $F_2$.

A hard disk drive according to the present invention comprises a suspension circuit board, wherein the suspension circuit board has
a metal support board;
a first insulation layer disposed on the metal support board, the first insulation layer being made of an insulation material;
a conductive layer disposed on the first insulation layer, the conductive layer forming a wire; and
a second insulation layer disposed on the first insulation layer and the conductive layer, the second insulation layer being made of an insulation material;
wherein:
the first insulation layer is provided with a first insulation opening;
the metal support board is provided with a metal support board opening at a position overlapping with the first insulation opening in a direction along which the conductive layer is extended, so that a rear surface of the conductive layer is exposed;
the second insulation layer is provided with a second insulation opening at a position overlapping with the first insulation opening in the direction along which the conductive layer is extended, so that a front surface of the conductive layer is exposed; and
upon applying a load in a thickness direction to the conductive layer at a position corresponding to the first insulation opening, $$F_1 < F_2,$$

when a stress generated in the conductive layer at a position corresponding to a periphery of the first insulation opening is represented as a first stress $F_1$ and a stress generated in the conductive layer at a position corresponding to a periphery of a metal support board opening is represented as a second stress $F_2$.

According to the present invention, when a load is applied in a thickness direction to a conductive layer at a position corresponding to a first insulation opening, a first stress $F_1$, which is generated in the conductive layer at a position corresponding to a periphery of the first insulation opening, is smaller than a second stress $F_2$, which is generated in the conductive layer at a position corresponding to a periphery of a metal support board opening. Thus, unlike the conventional method, it is possible to disperse the stress, which is concentrated in the position corresponding to the periphery of the first insulation opening of the conductive layer, to the side of the periphery of the metal support board opening, so as to prevent breaking of the conductive layer, without using a method of preventing breaking of the conductive layer, such as a design change of a flying lead portion of the conductive layer,

DETAILED DESCRIPTION OF THE INVENTION

An embodiment of a suspension circuit board, a suspension for hard disk and a hard disk drive according to the present invention will be described herebelow with reference to the drawings. FIGS. 1 to 14 show the embodiment of the present invention.

Figure 14:
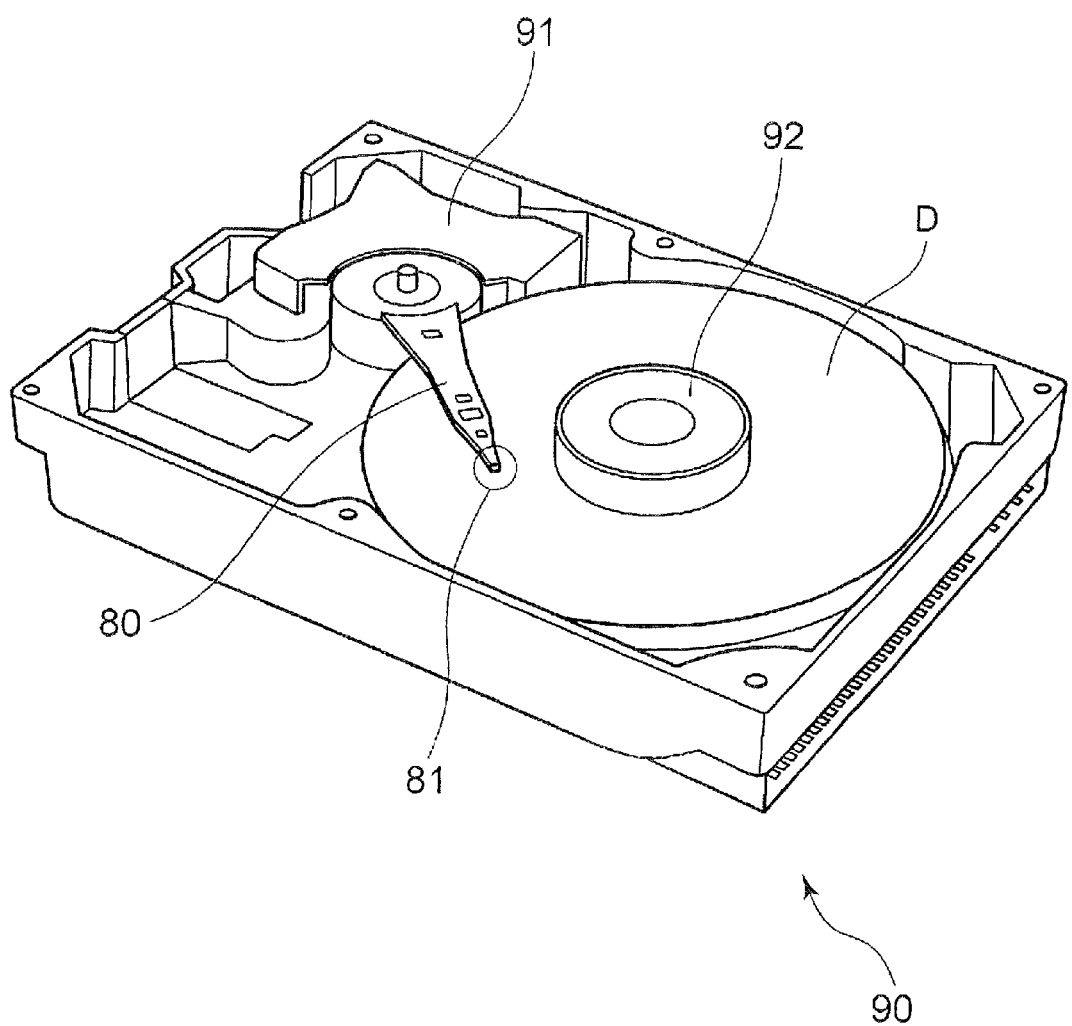
FIG. 14 is a perspective view showing a hard disk drive according to the present invention.

As shown in FIG. 14, a hard disk drive 90 in this embodiment includes a spindle motor 92 configured to rotate a magnetic disk D, a magnetic head suspension 80, and an actuator 91 configured to drive the magnetic head suspension 80. The magnetic head suspension 80 includes a magnetic head 81, a suspension for hard disk having a suspension circuit board 1 (see FIG. 5), and an external circuit board 20 (see FIG. 5).

As shown in FIGS. 1(a) and 1(b) to FIG. 4, the suspension circuit board 1 includes: a metal support board 12; a first insulation layer 11 disposed on the metal support board 12, the first insulation layer 11 being made of an insulation material; a conductive layer 10 disposed on the first insulation layer 11, the conductive layer forming a wire; and a second insulation layer 13 disposed on the first insulation layer 11 and the conductive layer 10, the second insulation layer 13 being made of an insulation material. As a material of the metal support board 12, stainless can be used, for example. As a material of the first insulation layer 11 and the second insulation layer 13, polyimide can be used, for example. As a material of the conductive layer 10, copper can be used, for example. However, the materials are not limited thereto.

Figure 1:
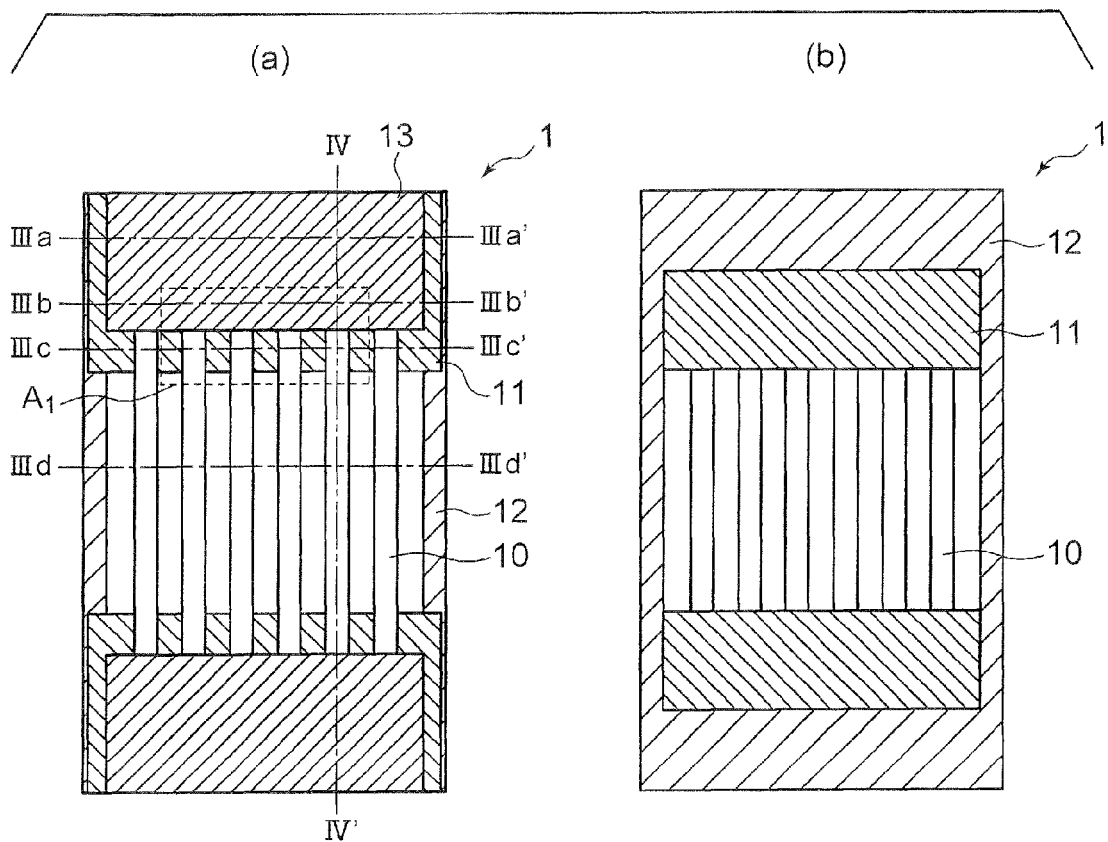
FIG. 1(a) is a top plane view of a flying lead portion and a part near thereto in a suspension circuit board according to an embodiment of the present invention, which are seen from above.
FIG. 1(b) is a bottom plane view thereof seen from below.
Figure 2:
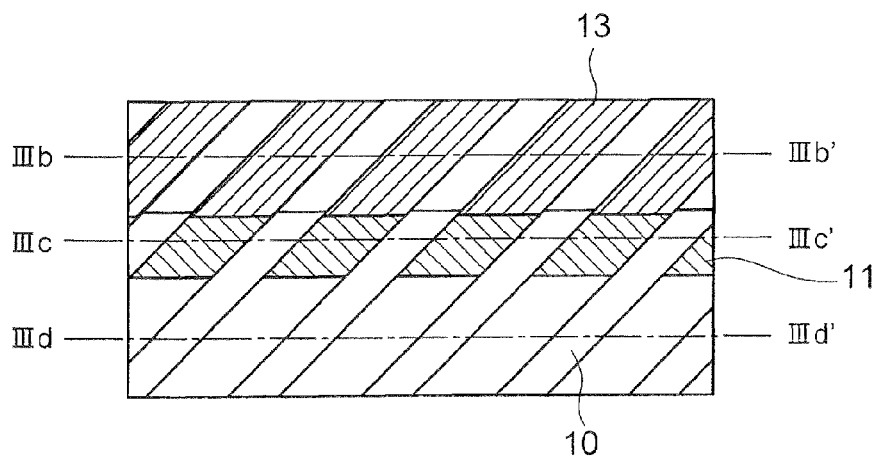
FIG. 2 is a perspective view of a part $A_1$ of FIG. 1(a), which are seen from an angle.
Figure 3:
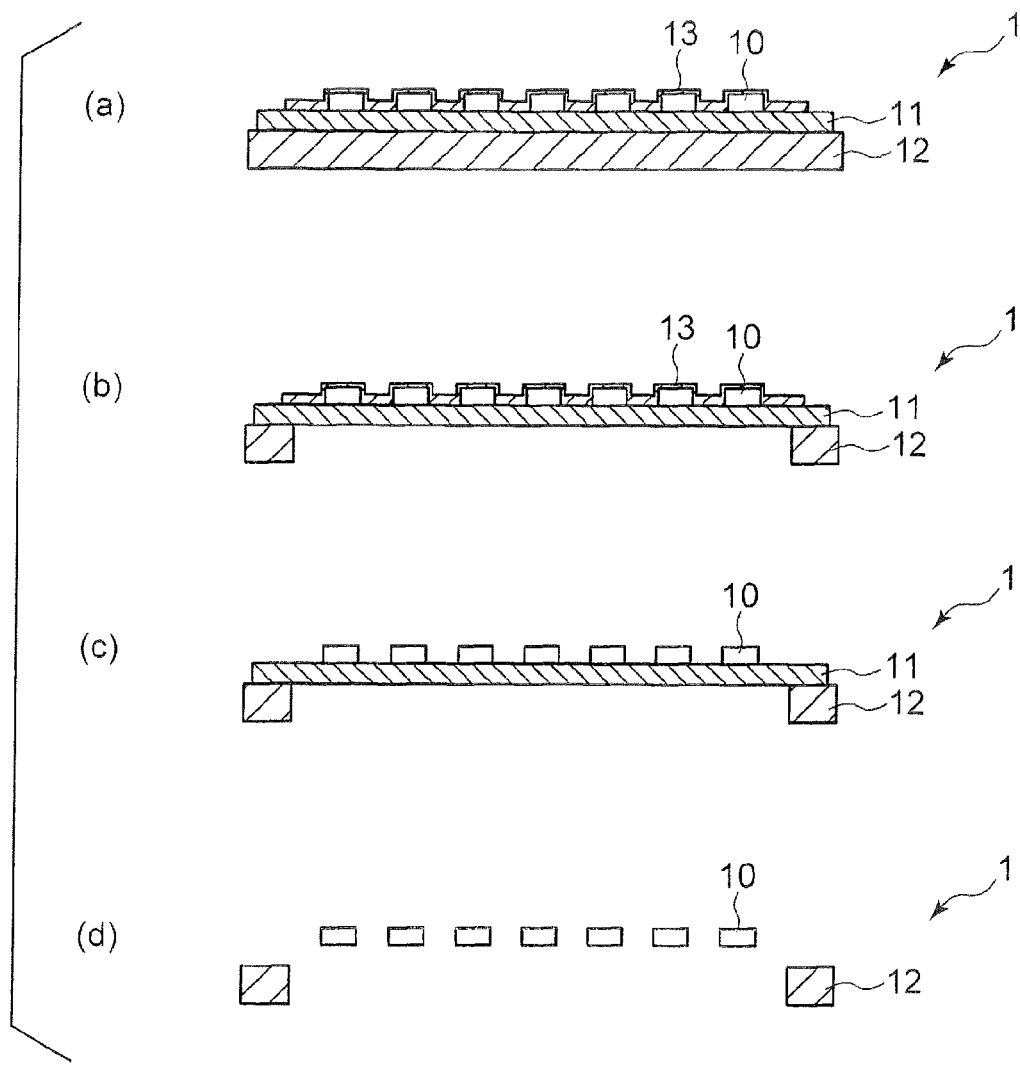
FIG. 3(a) is a cross-sectional view of the suspension circuit board cut along the line IIIa-IIIa' of FIG. 1(a)
FIG. 3(b) is a cross-sectional view of the suspension circuit board cut along the line IIIb-IIIb' of FIG. 1(a)
FIG. 3(c) is a cross-sectional view of the suspension circuit board cut along the line IIIc-IIIc' of FIG. 1(a)
FIG. 3(d) is a cross-sectional view of the suspension circuit board cut along the line IIId-IIId' of FIG. 1(a).
Figure 4:
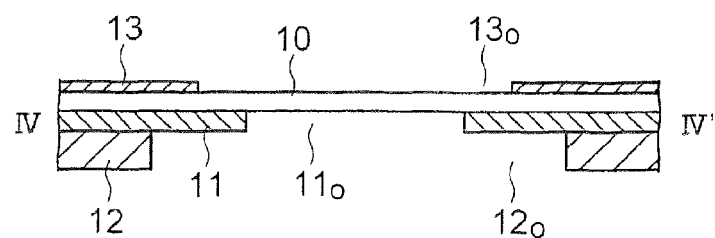
FIG. 4 is a longitudinal sectional view of the suspension circuit board cut along the line IV-IV' of FIG. 1(a).
Figure 5:
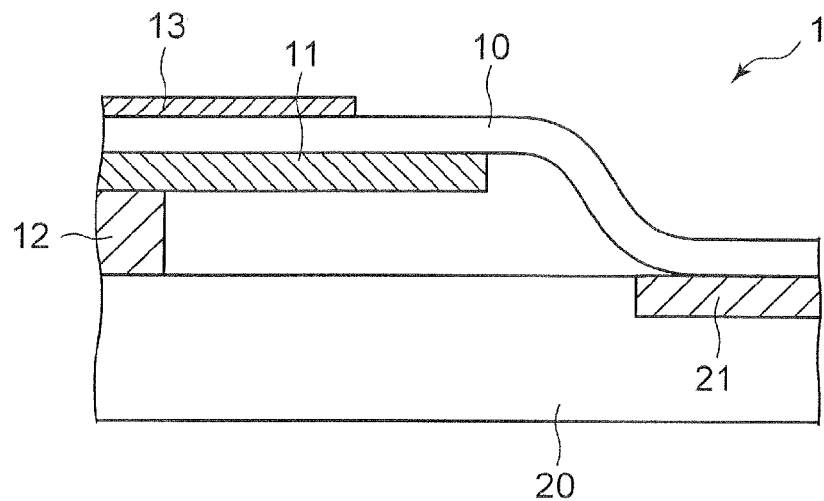
FIG. 5 is a longitudinal sectional view in which the suspension circuit board according to the embodiment of the present invention is bonded to an external circuit board.

FIG. 1(a) is a top plane view of the below-described flying lead portion and a part near thereto, which are seen from above, and FIG. 1(b) is a bottom plane view of the flying lead portion and the part near thereto, which are seen from below. FIG. 2 is a perspective view of a part $A_1$ of FIG. 1(a). FIGS. 3(a), 3(b), 3(c) and 3(d) are sectional views of the suspension circuit board 1 cut along the line the line the line IIIc-IIIc' and the line of FIG. 1(a), respectively. FIG. 4 is a sectional view of the suspension circuit board 1 cut along the line IV-IV' of FIG. 1(a).

Figure 6:
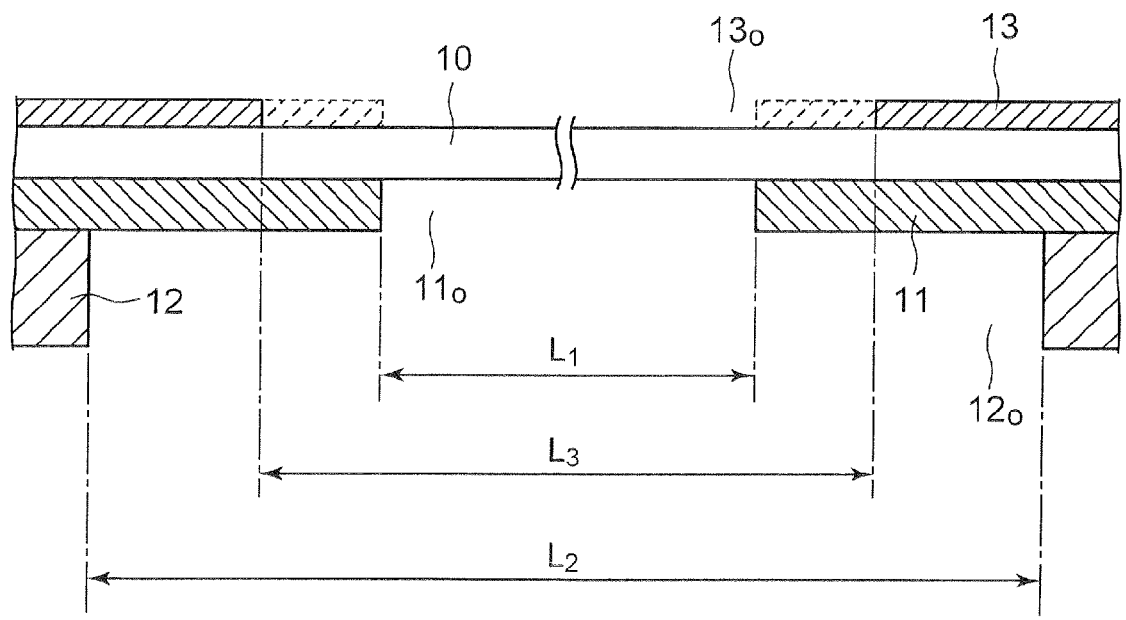
FIG. 6 is a longitudinal sectional view of the flying lead portion and a part near thereto of the suspension circuit board according to the embodiment of the present invention.
Figure 7:
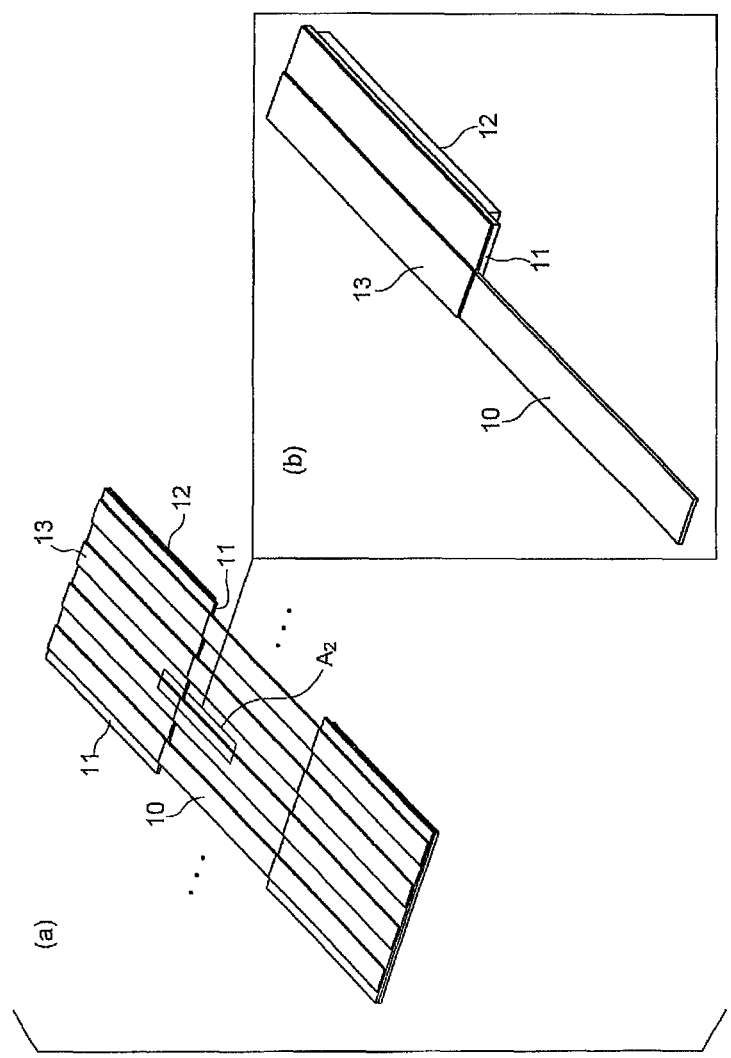
FIGS. 7(a) and 7(b) are perspective views for explaining an object to be analyzed used in examples of the present invention.
Figure 8:
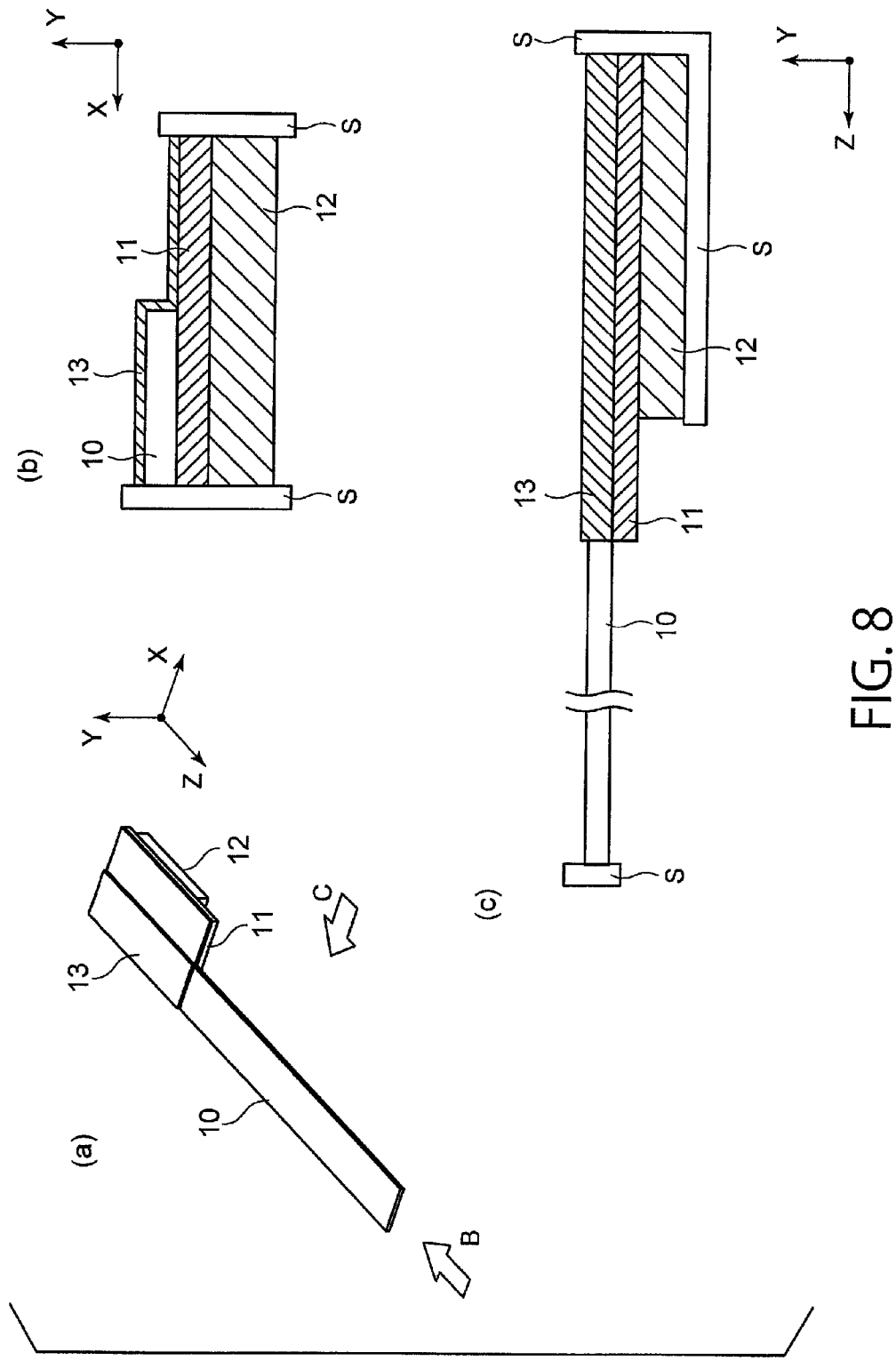
FIG. 8(a) is a perspective view for explaining a boundary condition of the object to be analyzed used in the examples of the present invention.
FIG. 8(b) is a front view of the object to be analyzed used in the examples of the present invention, which is seen from the arrow B in FIG. 8(a)
FIG. 8(c) is a side view of the object to be analyzed used in the examples of the present invention, which is seen from the arrow C in FIG. 8(a).

As shown in FIG. 6, the first insulation layer 11 is provided with a first insulation opening $11_0$. Two ends of the first insulation layer 11, which are located on a periphery of the first insulation opening $11_0$, are opposed to each other in a direction along which the wire, which is the conductive layer 10, is extended (in a direction along which the line IV-IV' of FIG. 1(a) is extended).

In addition, as shown in FIG. 6, the second insulation layer 13 is provided with a second insulation opening $13_0$ at a position overlapping with the first insulation opening $11_0$ in the direction along which the wire is extended. Two ends of the second insulation layer 13, which are located on a periphery of the second insulation opening $13_0$, are opposed to each other in the direction along which the wire is extended.

In addition, as shown in FIG. 6, the metal support board 12 is provided with a metal support board opening $12_0$ at a position overlapping with the first insulation opening $11_0$ and the second insulation opening $13_0$ in the direction along which the wire is extended. The metal support board 12 has a frame shape (see FIG. 1(b)), and supports the first insulation layer 11, the conductive layer 10 and the second insulation layer 13.

Because the second insulation opening $13_0$ is provided as described above, a front surface of the conductive layer 10 is exposed. On the other hand, because the metal support board opening $12_0$ is provided at the position overlapping with the first insulation opening $11_0$ in a direction along which the wire is extended, a rear surface of the conductive layer 10 is exposed. A part in which both the front surface and the rear surface of the conductive layer 10 forming the wire are exposed (a part corresponding to $L_1$ in FIG. 6) constitutes a flying lead portion.

In the flying lead portion, since both of the surfaces of the conductive layer 10 are exposed, ultrasonic waves are easily transmitted upon an ultrasonic bonding with an external circuit connection terminal portion 21. Thus, the flying lead portion can be bonded with a bonding portion 21 of an external circuit board 20 by ultrasonic bonding (see FIG. 5). Although not shown, a metal plating layer is formed on a surface of a flying lead 10 and a surface of the bonding portion 21 of the external circuit board 20, according to need. As the metal plating layer, a gold plating layer is formed by electroplating, for example.

In this embodiment, a length of the first insulation opening $11_0$ in a direction along which the wire is extended is represented as $L_1$, a length of the metal support board opening $12_0$ in a direction along which the wire is extended is represented as $L_2$, and a length of the second insulation opening $13_0$ in a direction along which the wire is extended is represented as $L_3$. In this case, a relationship among $L_1$, $L_2$ and $L_3$ is $L_1 \leq L_3 < L_2$. (in an aspect shown by the solid lines in FIG. 6, $L_1 < L_3 < L_2$, and in an aspect shown by the dotted lines in FIG. 6, $L_1 \leq L_3 < L_2$).

To be more specific, $L_1$ is between 0.4 mm and 2.0 mm, $L_2$ is between 0.54 mm and 4.0 mm, and $L_3$ is between 0.4 mm to 4.0 mm. The relationship among $L_1$, $L_2$ and $L_3$ is $L_1 \leq L_3 < L_2$.

When a load is applied to the conductive layer 10 at a position corresponding to the first insulation opening $11_0$ from above in a thickness direction, i.e., vertically from a side of the conductive layer 10 on which the metal support board 12 is not formed (see FIGS. 9 and 10), a relationship among a first stress $F_1$, a second stress $F_2$ and a third stress $F_3$ is $F_1 < F_2$ and $F_1 \leq F_3$, in which a stress generated in the conductive layer 10 at a position corresponding to the periphery of the first insulation opening $11_0$ is represented as the first stress $F_1$, a stress generated in the conductive layer 10 at a position corresponding to the periphery of the metal support board opening $12_0$ is represented as the second stress $F_2$, and a stress generated in the conductive layer 10 at a position corresponding to the periphery of the second insulation opening $13_0$ is represented as the third stress $F_3$.

Figure 10:
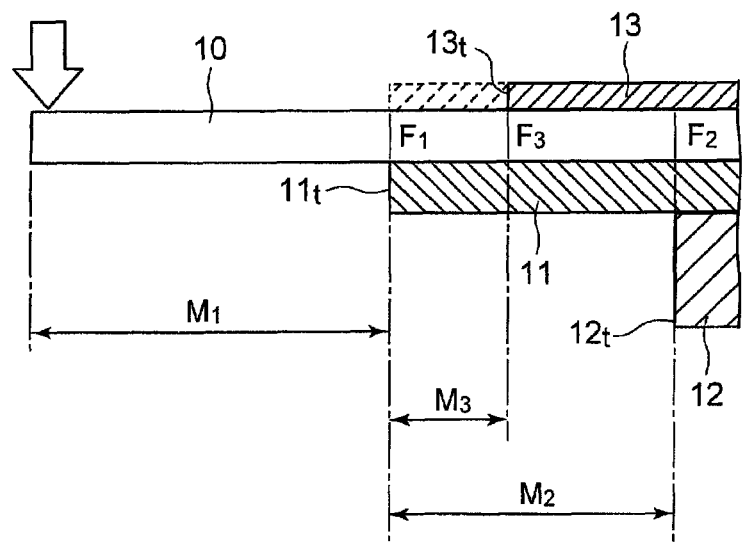
FIG. 10 is a longitudinal sectional view of the object to be analyzed used in the examples of the present invention.
Figure 11:
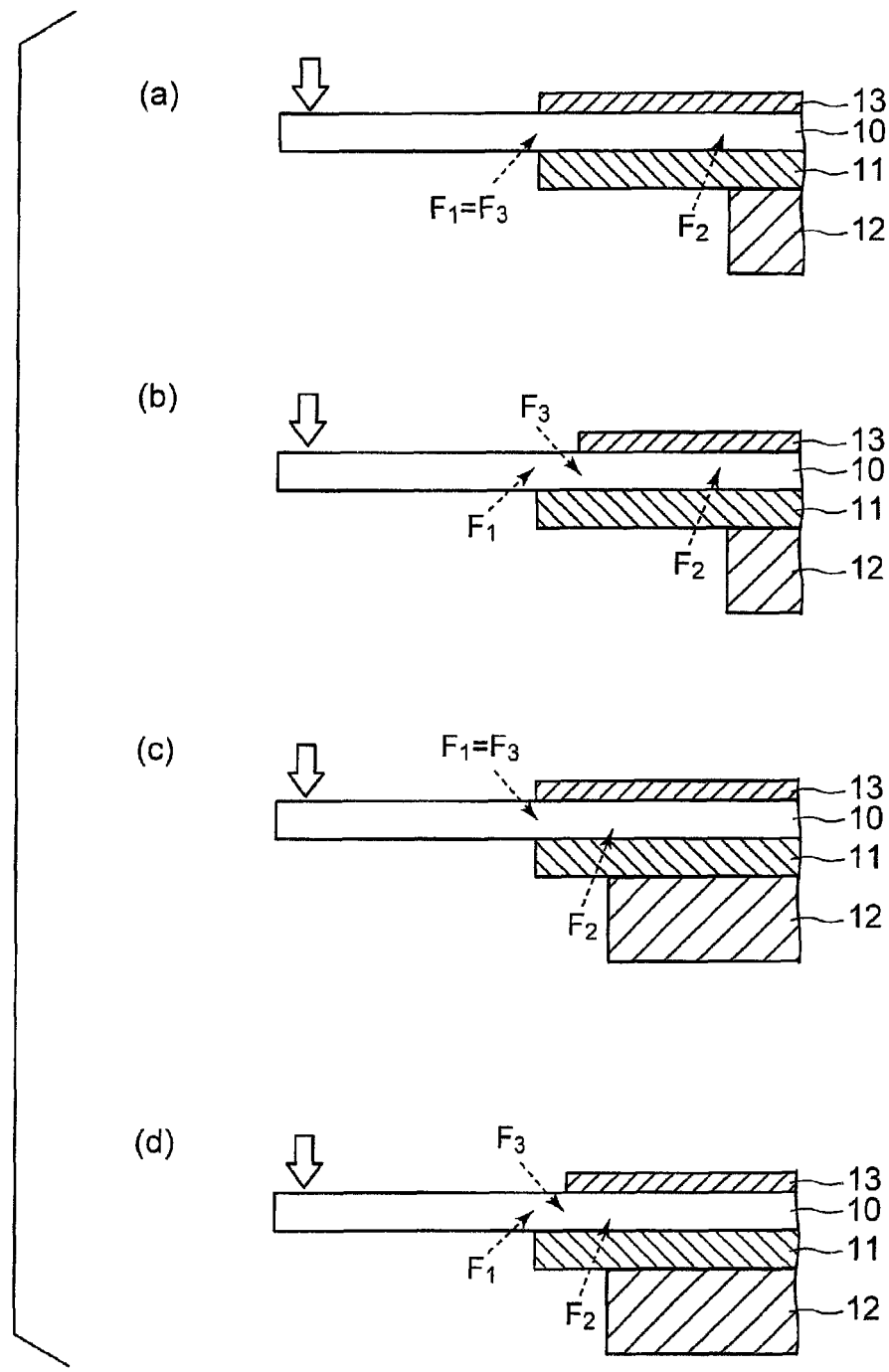
FIG. 11(a) is a longitudinal sectional view showing an aspect of Practical Example 1 of the present invention.
FIG. 11(b) is a longitudinal sectional view showing an aspect of Practical Example 2 of the present invention.
FIG. 11(c) is a longitudinal sectional view showing an aspect of Comparative Example 1.
FIG. 11(d) is a longitudinal sectional view showing an aspect of Comparative Example 2.

Each of the first stress $F_1$, the second stress $F_2$ and the third stress $F_3$ means an average stress generated in the front and the rear of the conductive layer 10 at each corresponding position (see FIG. 10). In this embodiment, in the conductive layer 10, the position which corresponds to the periphery of the first insulation opening $11_0$ means a position at which, when a straight line is vertically drawn from the periphery of the first insulation opening $11_0$, the straight line and the conductive layer 10 intersect with each other. Similarly, in the conductive layer 10, the position which corresponds to the periphery of the metal support board opening $12_0$ means a position at which, when a straight line is drawn from the periphery of the metal support board opening $12_0$, the straight line and the conductive layer 10 intersect with each other. In the conductive layer 10, the position which corresponds to the periphery of the second insulation opening $13_0$ means a position at which, when a straight line is drawn from the periphery of the second insulation opening $13_0$, the straight line and the conductive layer 10 intersect with each other.

EXAMPLES

Next, examples of the suspension circuit board 1 of the present invention will be described. The inventors of the present invention conducted a simulation test under conditions described below. An object to be analyzed in this simulation is a part corresponding to a part $A_2$ of FIG. 7(a), which was obtained by bisecting the flying lead portion of the conductive layer 10 in the longitudinal direction and in the width direction (see FIG. 7(b)).

As shown in FIG. 8(c), a distal end of the conductive layer 10 of the object to be analyzed was fixed by a fixing unit S, on the assumption that the conductive layer 10 is not displaced in a Z-direction. In addition, a bottom part of the metal support board 12 of the object to be analyzed was fixed by a fixing unit S in a Y-direction, in consideration that the metal support board 12 is normally supported on a surface plate. Proximal ends of the metal support board 12, the first insulation layer 11, the conductive layer 10 and the second insulation layer 13 were fixed by a fixing unit S in the Z-direction, in consideration that a structure is normally continued to a structural object. In addition, as shown in FIG. 8(b), the metal support board 12, the first insulation layer 11, the conductive layer 10 and the second insulation layer 13 were fixed by fixing units S in an X-direction, in consideration of a periodic symmetry. FIG. 8(a) is a perspective view for explaining a boundary condition of the object to be analyzed, FIG. 8(b) is a front view of the object to be analyzed seen from the arrow B in FIG. 8(a), and FIG. 8(c) is a side view of the object to be analyzed seen from the arrow C in FIG. 8(a).

In the analysis, a Young's modulus of the metal support board 12 was 150 GPa and a Poisson's ratio thereof was 0.3. A Young's modulus of the first insulation layer 11 was 7 GPa and a Poisson's ratio thereof was 0.3. A Young's modulus of the second insulation layer 13 was 5 GPa and a Poisson's ratio thereof was 0.3. A Young's modulus of the conductive layer 10 was 100 GPa, a yield stress thereof was 100 MPa and a Poisson's ratio thereof was 0.3.

The below Table 1 shows values of $M_1$, $M_2$ and $M_3$ and values of $F_1$, $F_2$ and $F_3$ used in the Practical Examples and Comparative Examples.

TABLE 1

|  | $M_1$ (μm) | $M_2$ (μm) | $M_3$ (μm) | $F_1$ (MPa) | $F_3$ (MPa) | $F_2$ (MPa) |
|---|---|---|---|---|---|---|
| Practical Example 1 | 500 | 400 | 0 | 60 | 60 | 71 |
| Practical Example 2 | 500 | 400 | 15 | 53 | 54 | 70 |
| Comparative Example 1 | 500 | 50 | 0 | 110 | 110 | 78 |
| Comparative Example 2 | 500 | 50 | 15 | 111 | 79 | 79 |

FIG. 11(a) is a longitudinal sectional view showing an aspect of Practical Example 1, FIG. 11(b) is a longitudinal sectional view showing an aspect of Practical Example 2, FIG. 11(c) is a longitudinal sectional view showing an aspect of Comparative Example 1, and FIG. 11(d) is a longitudinal sectional view showing an aspect of Comparative Example 2.

In Practical Example 1, since $M_3=0$ and $F_1$ and $F_3$ show stresses at the same position, $F_1$ and $F_3$ have values equal to each other (see FIG. 11(a)). Similarly, in Comparative Example 1, since $M_3=0$ and $F_1$ and $F_3$ show stresses at the same position, $F_1$ and $F_3$ have values equal to each other (see FIG. 11(c)).

Figure 9:
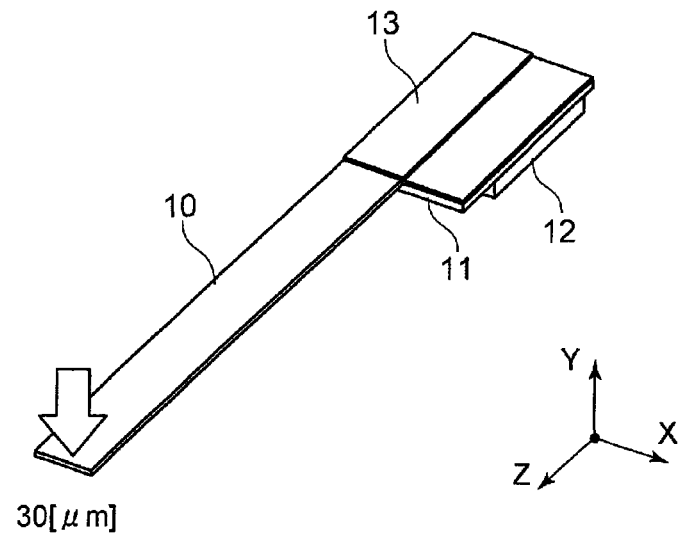
FIG. 9 is a perspective view for explaining a pressing state of the object to be analyzed used in the examples of the present invention.

As shown in FIG. 9, $F_1$, $F_2$ and $F_3$ in this embodiment are a first stress, a second stress and a third stress, respectively, when the distal end of the conductive layer 10 of the object to be analyzed was moved downward by 30 μm. In addition, $M_1$ represents a horizontal distance between the distal end of the conductive layer 10 of the object to be analyzed and an end $11_t$ of the first insulation layer 11 thereof. $M_3$ represents a horizontal distance between the end $11_t$ of the first insulation layer 11 and an end $13_t$ of the second insulation layer 13. $M_2$ represents a horizontal distance (setback distance) between the end $11_t$ of the first insulation layer 11 and an end $12_t$ of the metal support board 12 (see FIG. 10).

A relationship among $L_1$, $L_2$ and $L_3$, and $M_1$, $M_2$ and $M_3$ is as follows.

$L_1/2=M_1$ $(L_3-L_1)/2=M_3$ $(L_2-L_1)/2=M_2$

As shown in Table 1, according to Practical Examples 1 and 2, $F_1 \leq F_3 < F_2$ can be achieved. Thus, the stress generated at a position where the metal support board 12 is disposed can be decreased, and the stress generated at a flying lead end can be decreased.

Like Practical Examples, even when a stress generated in the conducive layer 10 increases at a position different from the flying lead portion, more specifically, at a position where not only the first insulation layer 11 and the second insulation layer 13 but also the metal support board 12 is disposed, there is no possibility that the conductive layer 10 is broken, because the conductive layer 10 is reinforced by the first insulation layer 11, the second insulation layer 13 and the metal support board 12. In this manner, by dispersing concentration of a stress generated in the conductive layer 10 to portions other than the flying lead portion, it is possible to decrease a stress generated in the flying lead end at which breaking of wire is likely to occur, therefore breaking of the conductive layer 10 can be prevented.

On the other hand, according to Comparative Examples 1 and 2 in which $F_1 \leq F_3 > F_2$, a stress increases in the flying lead end in which breaking of wire is likely to occur, whereby the conductive layer 10 tends to be broken. The conventional art has been made on the assumption that a stress, which is generated in the flying lead end at which breaking of wire is likely to occur, increases. Actually, in JP2003-31915A, a reinforcement part for reinforcing a conductive layer along an end periphery of an opening is formed at an intersection on which the end periphery of the opening and the conductive layer intersect with each other.

As shown in Practical Example 2, in the case where $L_1 < L_3 < L_2$ ($M_3 > 0$), a stress generated in the conductive layer 10 can be sequentially dispersed toward the side of the metal support board 12. Thus, a stress generated in the flying lead portion, in particular, the flying lead end can be decreased, therefore breaking of the conductive layer 10 can be more reliably prevented.

In addition, as in Practical Examples 1 and 2, it is preferable that a position of the conductive layer 10, which corresponds to the periphery of the first insulation opening $11_O$, and a position of the conductive layer 10, which corresponds to the periphery of the metal support board opening $12_O$, are located at the same height. To be more specific, it is preferable that the conductive layer 10 is horizontally, linearly extended between the position corresponding to the periphery of the first insulation opening $11_O$ and the position corresponding to the periphery of the metal support board opening $12_O$. According to such a structure, a local stress can be prevented from being generated in the conductive layer 10, whereby breaking of the conductive layer 10 can be more reliably prevented.

Further, the conductive layer 10 can be manufactured by various methods. For example, the conductive layer can be formed by a semi-additive method.

When the semi-additive method is used, the conductive layer 10 can have a slope shape or a step down shape being a step shape in the thickness direction, at the position corresponding to the periphery of the first insulation opening $11_O$. In the shape of such a conductive layer 10, a stress tends to concentrate particularly on a position where the shape is varied, therefore breaking of wire is likely to occur. Thus, with the use of the present invention, even on the position where the shape is varied, concentration of stress can be mitigated, so that breaking of wire can be effectively prevented.

Figure 12:
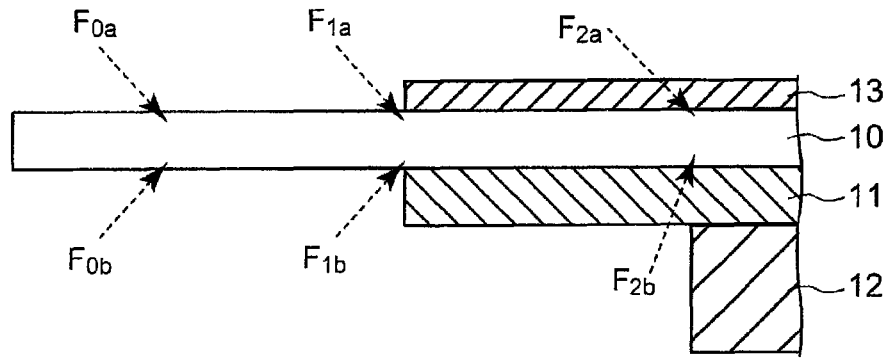
FIG. 12 is a longitudinal sectional view of the object to be analyzed which is used for explaining a relationship between a setback distance and a stress generated in a conductive layer.

Next, there is explained a relationship between a horizontal distance (setback distance) between the end $11_t$ of the first insulation layer 11 and the end $12_t$ of the metal support board 12, and a stress generated in the conductive layer 10. The below Table 2 shows a relationship between the setback distance and a stress in each measured position (see FIG. 12) on the conductive layer 10. In FIG. 12, $M_1$ is 500 μm. The data shown in Table 2 are numerical values obtained by moving downward the distal end of the conductive layer 10 of the object to be analyzed by 30 μm. In FIG. 12 and Table 2, a stress applied to a position of the conductive layer 10, which corresponds to the periphery of the first insulation opening $11_O$ on the side of the second insulation layer 13, is represented as $F_{1a}$. A stress applied to a position of the conductive layer 10, which corresponds to the first insulation opening $11_O$ on the side of the metal support board 12, is represented as $F_{1b}$. A stress applied to a position of the conductive layer 10, which corresponds to the periphery of the metal support board opening $12_O$ on the side of the second insulation layer 13, is represented as $F_{2a}$. A stress applied to a position of the conductive layer 10, which corresponds to the periphery of the metal support board opening $12_O$ on the side of the metal support board 12, is represented as $F_{2b}$. A stress applied to a position of the flying lead portion on the side of the second insulation layer 13 is represented as $F_{0a}$. A stress applied to a position of the flying lead portion on the side of the metal support board 12 is represented as $F_{0b}$.

TABLE 2

| Setback Distance (μm) | $F_{1a}$ (MPa) | $F_{1b}$ (MPa) | $F_{2a}$ (MPa) | $F_{2b}$ (MPa) | $F_{0a}$ (MPa) | $F_{0b}$ (MPa) |
|---|---|---|---|---|---|---|
| 50 | 120 | 100 | 103 | 53 | 83 | 83 |
| 100 | 109 | 97 | 103 | 55 | 76 | 78 |
| 200 | 101 | 44 | 103 | 55 | 61 | 70 |
| 300 | 104 | 25 | 103 | 48 | 46 | 68 |
| 400 | 77 | 43 | 103 | 39 | 34 | 66 |

Figure 13:
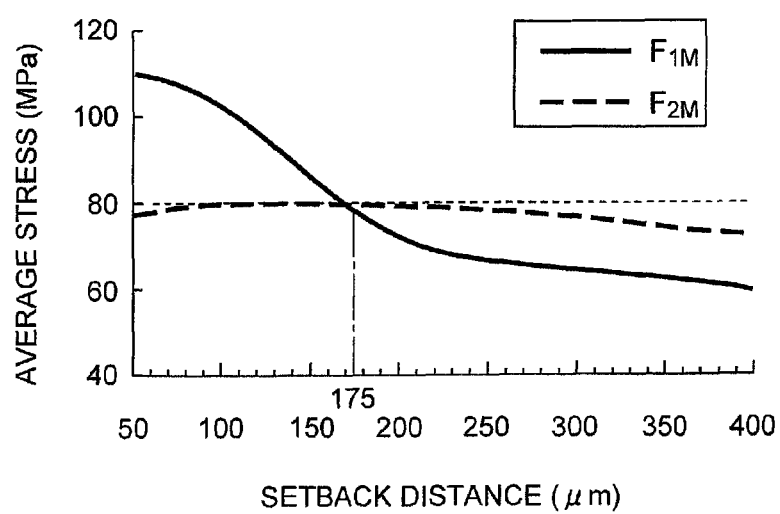
FIG. 13 is a graph showing a relationship between a setback distance and an average stress.

FIG. 13 shows a graph showing a relationship between the setback distance ($M_2$) and an average stress, in which an average value (average stress) of $F_{1a}$ and $F_{1b}$ is represented as $F_{1M}$, and an average value (average stress) of $F_{2a}$ and $F_{2b}$ is represented as $F_{2M}$.

As apparent from the graph shown in FIG. 13, when the setback distance is 175 μm, the values of $F_{1M}$ and $F_{2M}$ alternate. When the setback distance is shorter than 175 μm, $F_{1M} > F_{2M}$. On the other hand, when the setback distance is longer than 175 μm, $F_{1M} < F_{2M}$.

Therefore, when $M_1 = 500$ μm, by setting the setback distance to be 175 μm or more, a stress generated in the flying lead end can be made smaller than a stress generated in the conductive layer 10 at the positions where the first insulation layer 11, the second insulation layer 13 and the metal support board 12 are disposed.

As a result, when $L_2/L_1 (=(M_1+M_2)/M_1)$ is not less than 1.35 $(=(500+175)/500)$, a stress generated in the flying lead end can be made smaller than a stress generated in the conductive layer 10 at the positions where the first insulation layer 11, the second insulation layer 13 and the metal support board 12 are disposed. Thus, it can be said that there is a remarkable qualitative difference between when $L_2/L_1$ is 1.35 or more than 1.35, and when $L_2/L_1$ is less than 1.35. Namely, the numerical value 1.35 $(=L_2/L_1)$ has a critical significance.

In a case where $M_1=500$ μm, when the setback distance is 175 μm or more, both $F_{1M}$ and $F_{2M}$ become smaller than about 80 MPa. When a yield stress of the conductive layer 10 made of copper is generally 100 MPa. In consideration of variation in quality of material and possibility that stress is non-uniformly applied in a process, it is preferable that a stress applied to the conductive layer 10 in a normal state is 80 MPa or less (80% or less of the yield stress).

It is more preferable that the setback distance is 200 μm or more. This is because, a stress generated in the flying lead end can be sufficiently decreased, and the stress can be dispersed to portions other than the flying lead portion. In addition, as shown in FIG. 13, when the setback distance is 200 μm, there is provided an effect in which a stress, which is substantially the same as a stress applied when the setback distance is larger than 200 μm, can be lowered (in other words, a stress can be efficiently decreased, as long as the setback distance is not more than 200 μm). Thus, it can be said that setting of the setback distance to be 200 μm has a technical significance.

Next, there is described the present invention by using an aspect in which a position of the conductive layer 10, which corresponds to the periphery of the first insulation opening $11_0$, and a position of the conductive layer 10, which corresponds to the periphery of the metal support board opening $12_0$, are located at different heights, with the position corresponding to the periphery of the first insulation opening $11_0$ being located lower than the position corresponding to the periphery of the metal support board opening $12_0$. As such an aspect, it is possible to give an example in which the conductive layer 10 is extended downward in a slope shape (linearly), from the position corresponding to the periphery of the metal support board opening $12_0$ toward the position corresponding to the periphery of the first insulation opening $11_0$ (see FIG. 15(a)), and an example in which the conductive layer 10 is extended downward in a step shape, from the position corresponding to the periphery of the metal support board opening $12_0$ toward the position corresponding to the periphery of the first insulation opening $11_0$ (see FIG. 15(b)).

Figure 15:
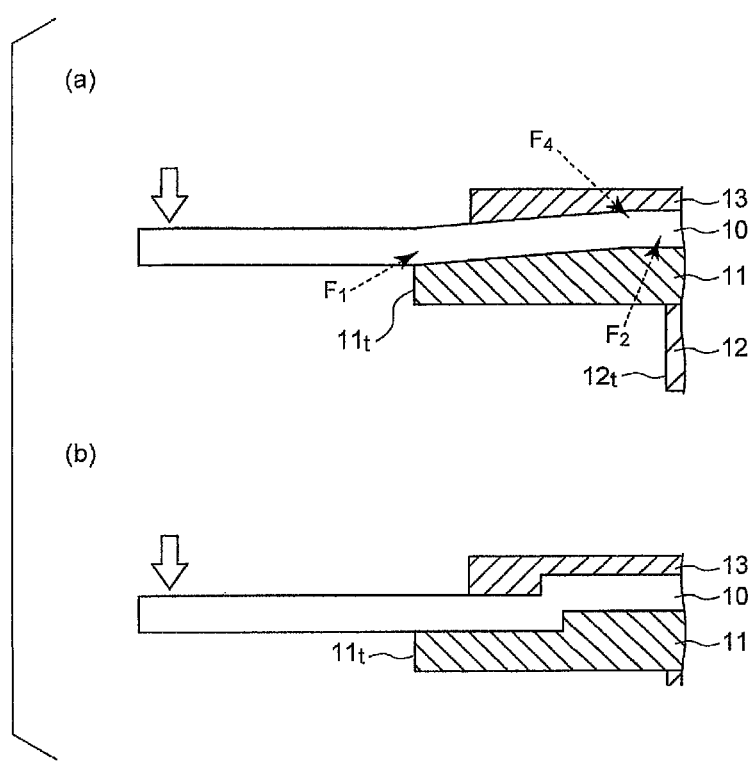
FIGS. 15(a) and 15(b) are longitudinal sectional view showing another object to be analyzed, in which a position of a conductive layer corresponding to a periphery of a first insulation opening and a position of the conductive layer corresponding to a periphery of a metal support board opening are located at different heights.

Herebelow, there is explained a result of an experiment using an object to be analyzed in which, as shown in FIG. 15(a), the conductive layer was extended downward in a slope shape, from the position corresponding to the periphery of the metal support board opening $12_0$ toward the position corresponding to the periphery of the first insulation opening $11_0$. To be more specific, there is explained the experiment result of the object to be analyzed shown in FIG. 15(a) about a relationship between a horizontal distance (setback distance) between the end $11_t$ of the first insulation layer 11 and the end $12_t$ of the metal support board 12, and a stress generated in the conductive layer 10.

The below Table 3 shows a relationship between the setback distance and each measured position (see FIG. 15(a)) on the conductive layer 10. A horizontal distance $M_1$ between the distal end of the conductive layer 10 and the end $11_t$ of the first insulation layer 11 was 500 μm. The data shown in Table 3 are numerical values obtained by moving downward the distal end of the conductive layer 10 of the object to be analyzed by 22 μm. The reason of the value of 22 μm is as follows. Namely, since a height difference between the position of the conductive layer 10, which corresponds to the periphery of the metal support board opening $12_0$, and the position of the conductive layer 10, which corresponds to the periphery of the first insulation opening $11_0$ is 8 μm, the value 8 μm is deducted from the moving amount of 30 μm in the experiment result shown in Table 2.

In FIG. 15(a), a stress generated in the conductive layer 10 at a position on which the conductive layer 10 is started to move downward from the position corresponding to the periphery of the metal support board opening $12_0$ toward the position corresponding to the periphery of the first insulation opening $11_0$ is represented as a fourth stress $F_4$, when a load is vertically applied from the side of the conductive layer 10 on which the metal support board 12 is not formed (see FIGS. 9 and 10). In Table 3, a stress applied to the position on which the conductive layer 10 is started to move downward on the side of the second insulation layer 13 is represented as $F_{4a}$, and a stress applied to the position on which the conductive layer 10 is started to move downward on the side of the metal support board 12 is represented as $F_{4b}$.

TABLE 3

| Setback Distance (μm) | $F_{1a}$ (MPa) | $F_{1b}$ (MPa) | $F_{2a}$ (MPa) | $F_{2b}$ (MPa) | $F_{0a}$ (MPa) | $F_{0b}$ (MPa) | $F_{4a}$ (MPa) | $F_{4b}$ (MPa) |
|---|---|---|---|---|---|---|---|---|
| 50 | 113 | 112 | 66.9 | 45.9 | 55.8 | 55 | 38.6 | 92.6 |
| 100 | 110 | 109 | 98.3 | 41.4 | 54.8 | 54.3 | 43.3 | 95.2 |
| 200 | 106 | 107 | 101 | 47.2 | 51.8 | 53.2 | 34.9 | 96.1 |
| 300 | 104 | 89.8 | 102 | 46.6 | 44.7 | 51.7 | 22.5 | 91.6 |
| 400 | 102 | 49 | 101 | 42.6 | 35.5 | 50.3 | 14.5 | 86.2 |
| 500 | 106 | 27.7 | 102 | 37.8 | 27.1 | 48.3 | 10.6 | 79.5 |

Figure 16:
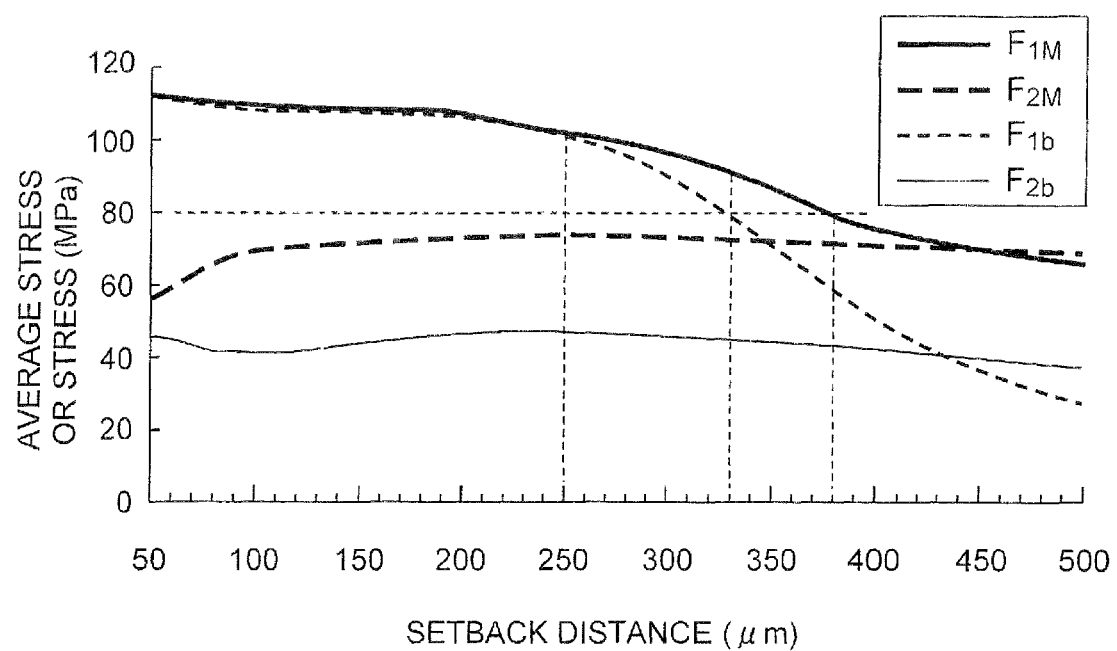
FIG. 16 is a graph showing a relationship between a setback distance and an average stress or a relationship between a setback distance and a stress, in the other object to be analyzed shown in FIG. 15(a).

In FIG. 16, an average value (average stress) of $F_{1a}$ and $F_{1b}$ is represented as $F_{1M}$, and an average value (average stress) of $F_{2a}$ and $F_{2b}$ is represented as $F_{2M}$. FIG. 16 shows a graph showing a relationship between the setback distance ($M_2$) and the average stress $F_{1M}$, a graph showing a relationship between the setback distance ($M_2$) and the average stress $F_{2M}$, a graph showing a relationship between the setback distance ($M_2$) and the stress $F_{1b}$, and a graph showing a relationship between the setback distance ($M_2$) and the stress $F_{2b}$.

As understood from FIG. 16, when the setback distance is 200 μm or more, F1b is started to separate from $F_{1M}$, i.e., $F_{1b}$ is started to decrease, as compared with $F_{1a}$. When the setback distance is 330 μm or more, $F_{1b}$ becomes 80 MPa or less, whereby a stress applied to the position of the conductive layer 10, which corresponds to the periphery of the first insulation opening $11_0$ on the side of the metal support board 12, can be made 80 MPa or less (80% or less of the yield stress). Further, when the setback distance is 380 μm or more, $F_{1M}$ becomes 80 MPa or less, whereby an average stress applied to the position of the conductive layer 10, which corresponds to the periphery of the first insulation opening $11_0$, can be made 80 MPa or less (80% or less of the yield stress).

As described above, it can be understood that, when the setback distance is increased, the first stress $F_1$ (in particular, $F_{1b}$) generated in the conductive layer 10 at the position corresponding to the periphery of the first insulation opening $11_0$ can be advantageously decreased. In each of the cases where the setback distance is 200 μm, where the setback distance is 330 μm and where the setback distance is 380 μm, it can be said that there is a remarkable qualitative difference therebetween. However, because of a restriction in design, it should be noted that the setback distance is about 500 μm at most.

The invention claimed is:

1. A suspension circuit board comprising:
a metal support board;
a first insulation layer disposed on the metal support board, the first insulation layer being made of an insulation material;
a conductive layer disposed on the first insulation layer, the conductive layer forming a wire; and
a second insulation layer disposed on the first insulation layer and the conductive layer, the second insulation layer being made of an insulation material;
wherein:
the first insulation layer is provided with a first insulation opening;
the metal support board is provided with a metal support board opening at a position overlapping with the first insulation opening in a direction along which the conductive layer is extended, so that a rear surface of the conductive layer is exposed;
the second insulation layer is provided with a second insulation opening at a position overlapping with the first insulation opening in the direction along which the conductive layer is extended, so that a front surface of the conductive layer is exposed;
when a length of the first insulation opening in the direction along which the conductive layer is extended is represented as a length $L_1$, a length of the metal support board opening in the direction along which the conductive layer is extended is represented as a length $L_2$, and a length of the second insulation opening in the direction along which the conductive layer is extended is represented as a length $L_3$, $L_1 < L_3 < L_2$, and $L_2 \geq 1.35 \times L_1$; and upon applying a load in a thickness direction to the conductive layer at a position corresponding to the first insulation opening, $F_1 < F_2$, when a stress generated in the conductive layer at a position corresponding to a periphery of the first insulation opening is represented as a first stress $F_1$ and a stress generated in the conductive layer at a position corresponding to a periphery of the metal support board opening is represented as a second stress $F_2$.

2. The suspension circuit board according to claim 1, wherein
upon applying a load in the thickness direction to the surface of the conductive layer at a position corresponding to the first insulation opening, $F_1 \leq F_3$ and $F_1 < F_2$, when a stress generated in the conductive layer at a position corresponding to a periphery of the second insulation opening is represented as a third stress $F_3$.

3. The suspension circuit board according to claim 1, wherein
a position of the conductive layer, which corresponds to the periphery of the first insulation opening, and a position of the conductive layer, which corresponds to the periphery of the metal support board opening, are located at the same height.

4. The suspension circuit board according to claim 1, wherein
a position of the conductive layer, which corresponds to the periphery of the first insulation opening, and a position of the conductive layer, which corresponds to the periphery of the metal support board opening, are located at different heights, and
the position corresponding to the periphery of the first insulation opening is located lower than the position corresponding to the periphery of the metal support board opening.

5. The suspension circuit board according to claim 4, wherein the conductive layer is extended in a slope shape or in a step shape, from the position corresponding to the periphery of the metal support board opening toward the position corresponding to the periphery of the first insulation opening.

6. The suspension circuit board according to claim 1, wherein the suspension circuit board is capable of being bonded to an external circuit board by ultrasonic bonding.

7. A suspension for hard disk comprising a suspension circuit board,
wherein the suspension circuit board has
a metal support board;
a first insulation layer disposed on the metal support board, the first insulation layer being made of an insulation material;
a conductive layer disposed on the first insulation layer, the conductive layer forming a wire; and
a second insulation layer disposed on the first insulation layer and the conductive layer, the second insulation layer being made of an insulation material;
wherein:
the first insulation layer is provided with a first insulation opening;
the metal support board is provided with a metal support board opening at a position overlapping with the first insulation opening in a direction along which the conductive layer is extended, so that a rear surface of the conductive layer is exposed;
the second insulation layer is provided with a second insulation opening at a position overlapping with the first insulation opening in the direction along which the conductive layer is extended, so that a front surface of the conductive layer is exposed;
when a length of the first insulation opening in the direction along which the conductive layer is extended is represented as a length $L_1$, a length of the metal support board opening in the direction along which the conductive layer is extended is represented as a length $L_2$, and a length of the second insulation opening in the direction along which the conductive layer is extended is represented as a length $L_3$, $L_1 < L_3 < L_2$, and $L_2 \geq 1.35 \times L_1$; and upon applying a load in a thickness direction to the conductive layer at a position corresponding to the first insulation opening, $F_1 < F_2$, when a stress generated in the conductive layer at a position corresponding to a periphery of the first insulation opening is represented as a first stress $F_1$ and a stress generated in the conductive layer at a position corresponding to a periphery of the metal support board opening is represented as a second stress $F_2$.

8. A hard disk drive comprising a suspension circuit board, wherein the suspension circuit board has a metal support board;

a first insulation layer disposed on the metal support board, the first insulation layer being made of an insulation material;

a conductive layer disposed on the first insulation layer, the conductive layer forming a wire; and a second insulation layer disposed on the first insulation layer and the conductive layer, the second insulation layer being made of an insulation material;

wherein:

the first insulation layer is provided with a first insulation opening;

the metal support board is provided with a metal support board opening at a position overlapping with the first insulation opening in a direction along which the conductive layer is extended, so that a rear surface of the conductive layer is exposed;

the second insulation layer is provided with a second insulation opening at a position overlapping with the first insulation opening in the direction along which the conductive layer is extended, so that a front surface of the conductive layer is exposed;

when a length of the first insulation opening in the direction along which the conductive layer is extended is represented as a length $L_1$, a length of the metal support board opening in the direction along which the conductive layer is extended is represented as a length $L_2$, and a length of the second insulation opening in the direction along which the conductive layer is extended is represented as a length $L_3$, $L_1 < L_3 < L_2$, and $L_2 \geq 1.35 \times L_1$; and upon applying a load in a thickness direction to the conductive layer at a position corresponding to the first insulation opening, $F_1 < F_2$, when a stress generated in the conductive layer at a position corresponding to a periphery of the first insulation opening is represented as a first stress $F_1$ and a stress generated in the conductive layer at a position corresponding to a periphery of the metal support board opening is represented as a second stress $F_2$.

* * * * *